(12) United States Patent
Tomioka et al.

(10) Patent No.: US 9,448,448 B2
(45) Date of Patent: Sep. 20, 2016

(54) LIQUID CRYSTAL DISPLAY DEVICE

(71) Applicant: Japan Display Inc., Tokyo (JP)

(72) Inventors: Yasushi Tomioka, Tokyo (JP); Takato Hiratsuka, Tokyo (JP); Osamu Itou, Tokyo (JP)

(73) Assignee: Japan Display Inc., Tokyo (JP)

( * ) Notice: Subject to any disclaimer, the term of this patent is extended or adjusted under 35 U.S.C. 154(b) by 9 days.

(21) Appl. No.: 14/508,277

(22) Filed: Oct. 7, 2014

(65) Prior Publication Data

US 2015/0098048 A1 Apr. 9, 2015

(30) Foreign Application Priority Data

Oct. 8, 2013 (JP) .................................. 2013-211327

(51) Int. Cl.
*G02F 1/1339* (2006.01)
*G02F 1/1343* (2006.01)
*G02F 1/1335* (2006.01)

(52) U.S. Cl.
CPC ..... *G02F 1/134363* (2013.01); *G02F 1/13394* (2013.01); *G02F 1/133512* (2013.01); *G02F 1/133514* (2013.01)

(58) Field of Classification Search
CPC ................... G02F 1/13394; G02F 1/134363
USPC ......................................... 349/155–157, 141
See application file for complete search history.

(56) References Cited

U.S. PATENT DOCUMENTS

| 5,517,343 | A | 5/1996 | Yamahara et al. |
| 7,755,737 | B2 * | 7/2010 | Taniguchi ........... G02F 1/13394 349/106 |
| 2004/0189928 | A1 * | 9/2004 | Yang ................... G02F 1/13394 349/155 |
| 2007/0002263 | A1 * | 1/2007 | Kim .................... G02F 1/13394 349/156 |
| 2008/0266498 | A1 * | 10/2008 | Kim .................... G02F 1/13394 349/110 |

FOREIGN PATENT DOCUMENTS

| JP | 6-214244 A | 8/1994 |
| JP | 6-332014 A | 12/1994 |
| JP | 11-231344 A | 8/1999 |

OTHER PUBLICATIONS

Sitao Huo et al. Horizontal Electrical Field Switching (HEFS) Mode LCD with Slanted Electrodes, Proceedings of China Display/Asia Display 2011, pp. 597-600.

* cited by examiner

*Primary Examiner* — Thanh-Nhan P Nguyen
(74) *Attorney, Agent, or Firm* — TYPHA IP LLC

(57) ABSTRACT

A liquid crystal display device includes a TFT substrate, a CF substrate, and a liquid crystal interposed between the TFT substrate and the CF substrate, and drives the liquid crystal in a horizontal electric field. The TFT substrate includes a recess, and the CF substrate includes a columnar protrusion. The protrusion of the CF substrate is fitted to the recess of the TFT substrate so as to function as a stopper for preventing a positional gap between the TFT substrate and the CF substrate.

15 Claims, 6 Drawing Sheets

F I G . 5B
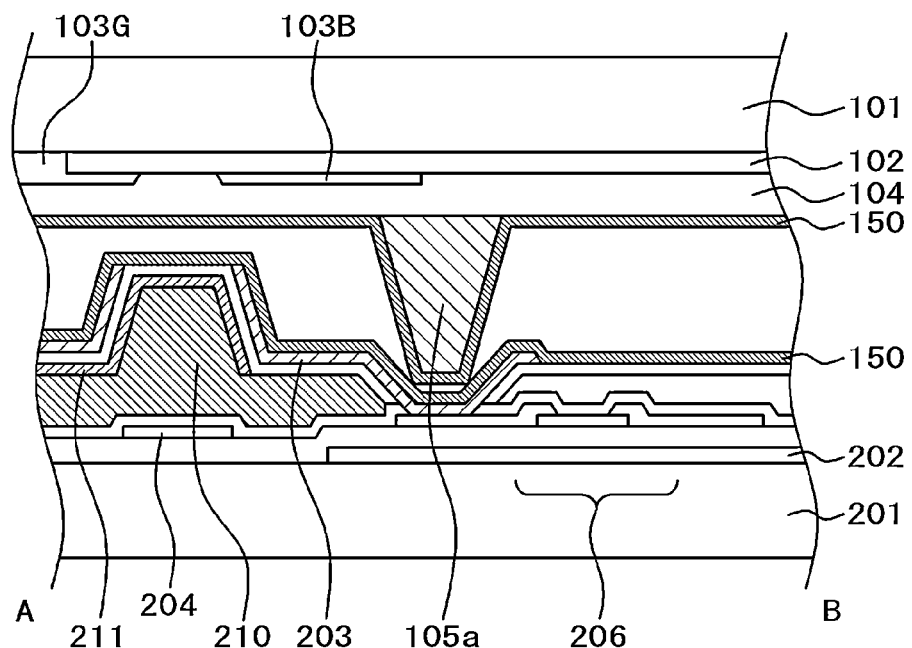

LIQUID CRYSTAL DISPLAY DEVICE

CLAIM OF PRIORITY

The present application claims priority from Japanese patent application JP 2013-211327 filed on Oct. 8, 2013 the content of which is hereby incorporated by reference into this application.

FIELD OF THE INVENTION

The present invention relates to a liquid crystal display device of horizontal electric field (IPS: In Plane Switching) type.

BACKGROUND OF THE INVENTION

The IPS type liquid crystal display device is configured that the electric field for driving the liquid crystal layer is directed to be in substantially parallel with a principal plane of a TFT substrate (in a horizontal direction) so that the viewing angle is wider than that of the twisted nematic (TN) type for driving the liquid crystal layer in the longitudinal electric field.

Although the IPS type liquid crystal display device provides the wide viewing angle, the planar configuration of electrodes has the small aperture ratio, resulting in the problem of low transmittance. The wall electrode IPS type liquid crystal display device has been proposed for coping with the aforementioned problem (JP-A-6-214244, JP-A-6-332014, JP-A-11-231344, and Proceedings of China Display/Asia Display 2011, P2-23, pp. 597-600). The wall electrode IPS type liquid crystal display device is designed to have the electrode with the wall-like structure. The aforementioned device includes two types, one is configured to form the electrode itself into the wall-like structure, and the other is configured to form the electrode on the side wall of the wall-like insulating film. Any of those types allows the electrode to keep a substantial area while reducing the area on the plane to maintain the aperture ratio, as well as improve the transmittance.

SUMMARY OF THE INVENTION

The inventors investigated the wall electrode IPS type liquid crystal display device, which is conceived as being capable of securing both the viewing angle and the transmittance. FIG. 2A is a plan view of a main part of the liquid crystal display device investigated by the inventors. A wall electrode 203 serving as a pixel electrode is formed on a side wall of a wall-like insulating film (wall) 210 with height of 3 μm at the TFT substrate side. A counter electrode (common electrode) 211 is provided between the adjacent wall electrodes 203. A parallel electric field is generated between the wall electrode 203 and the counter electrode 211. A black matrix (BM) film 102 is formed on a counter substrate (CF substrate) along the wall 210. It is noted that reference numeral 320 denotes a sub pixel, and specifically, red, green and blue sub pixels constitute the pixel. FIG. 2B is a sectional view taken along line A-B of FIG. 2A. The wall 210 is formed on the insulating film which covers a drain wiring 204 to be formed as an image signal line, and the counter electrode 211 is further formed thereon. The wall electrode 203 is formed on the side wall part of the wall 210 via the insulating film. A liquid crystal layer 300 is interposed between the counter substrate formed by applying the black matrix 102, a color filter 103 (red filter 103R, blue filter 103B, green filter 103G), and an overcoat (OC) 104 onto a glass substrate 101, and the TFT substrate via an alignment film 150. It is preferable to use a photo alignment film for the liquid crystal display device according to the present invention as the alignment film applied to the side wall. It is noted that reference numeral 205 denotes an insulating film.

The above-structured liquid crystal display device has revealed the problem as described below. The wall electrode IPS type liquid crystal display device to which the photo alignment technique is applied is configured that the wall-like structure on which the electrodes are formed holds the cell gap between the upper and the lower substrates. In the aforementioned structure, if the positional gap between the upper and the lower substrates is caused by friction and impact on the display, there may be a concern of such failure as the alignment failure owing to the flaw on the alignment film of the counter substrate resulting from the wall movement, and the display failure, for example, bright point generated by the scrap of stripped film.

Although JP-A-6-214244, JP-A-6-332014 and Proceedings of China Display/Asia Display 2011, P2-23, pp. 59-600 disclose the structure which allows the wall part of the wall electrode to hold the cell gap, the problem as described above is not referenced. JP-A-11-231344 discloses the spacer function which becomes effective if the thickness of the common electrode or the pixel electrode equals 100% of the cell thickness. However, it does not reference the aforementioned problem which may occur in such a case, nor the structure for holding the cell gap if the thickness of the common electrode or the pixel electrode is less than 100% of the cell thickness. Any one of those literatures does not disclose the use of the photo alignment film.

It is an object of the present invention to provide a liquid crystal display device capable of lessening deterioration in the image quality owing to friction and impact.

The present invention provides a liquid crystal display device including a first substrate, a second substrate, and a liquid crystal interposed between the first substrate and the second substrate, which drives the liquid crystal in a horizontal electric field. The first substrate has a recess. The second substrate has a columnar protrusion. The protrusion of the second substrate is fitted to the recess of the first substrate so as to function as a stopper for preventing a positional gap between the first substrate and the second substrate.

The present invention further provides a liquid crystal display device including a first substrate, a second substrate on which a black matrix (BM) is formed, and a liquid crystal interposed between the first substrate and the second substrate, which drives the liquid crystal in a horizontal electric field. The first substrate includes a wall-like protrusion provided with a first electrode, and a second electrode which is formed between the adjacent wall-like protrusions for generating the horizontal electric field between the first electrode and the second electrode for each sub pixel. The second substrate includes a columnar spacer provided in a region where the black matrix is formed in planar view corresponding to a recess on an extension of the wall-like protrusion of the sub pixel for holding a cell gap between the first substrate and the second substrate. The columnar spacer is fitted to the recess between the wall-like protrusions of the sub pixel so as to function as a stopper for preventing a positional gap between the first and the second substrate.

The present invention provides a liquid crystal display device including a first substrate where a TFT is formed, a second substrate where a black matrix (BM) is formed, and a liquid crystal interposed between the first substrate and the second substrate, which drives the liquid crystal in a horizontal electric field. The first substrate includes a wall-like protrusion provided with a first electrode, a second electrode which is formed between the adjacent wall-like protrusions for generating the horizontal electric field between the first electrode and the second electrode, and a contact hole for electrical contact with a conductive region which constitutes the TFT for each sub pixel. The second substrate includes a columnar spacer provided in a region where the black matrix is formed in planar view corresponding to the contact hole of the sub pixel for holding a cell gap between the first substrate and the second substrate. The columnar spacer is fitted to the contact hole of the sub pixel so as to function as a stopper for preventing a positional gap between the first and the second substrate.

The present invention provides the liquid crystal display device capable of lessening the image quality deterioration owing to friction and impact.

BRIEF DESCRIPTION OF THE DRAWINGS

FIG. 5B is a schematic sectional view of the main part of the liquid crystal display device, taken along line A-B of FIG. 5A.

DESCRIPTION OF THE PREFERRED EMBODIMENTS

Figure 1A:
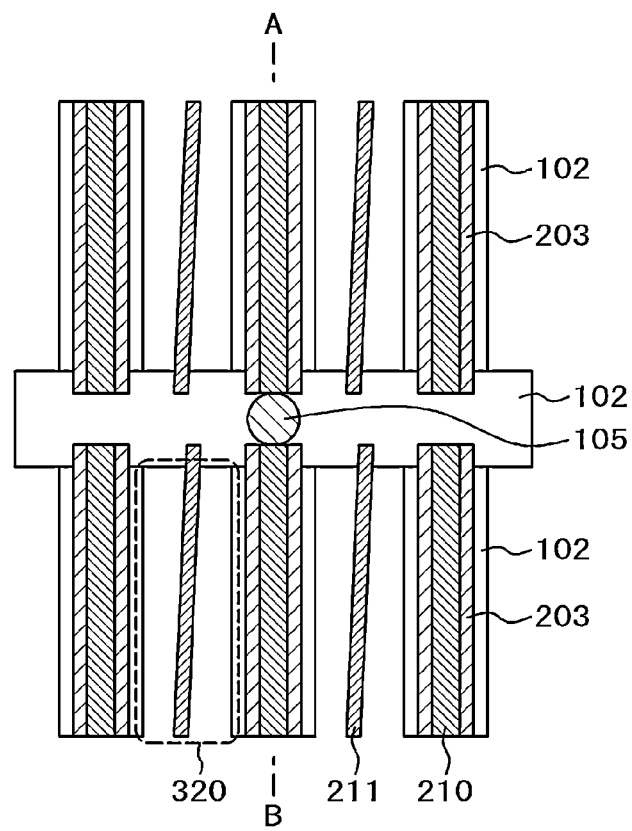
FIG. 1A is a schematic plan view of a main part of a liquid crystal display device according to an embodiment of the present invention.
Figure 1B:
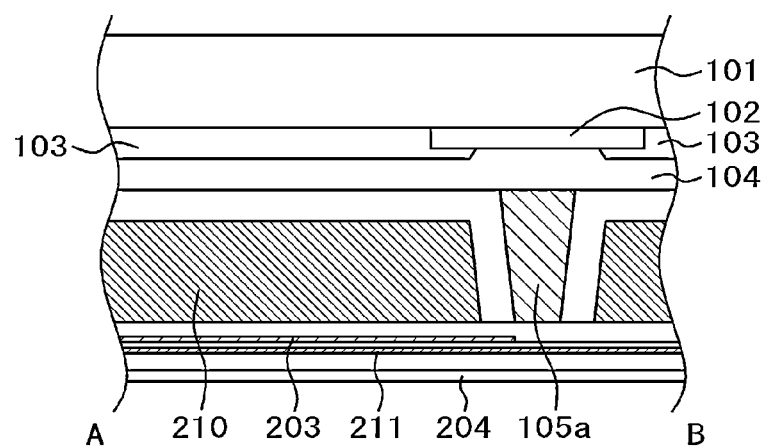
FIG. 1B is a schematic sectional view of the main part of the liquid crystal display device, taken along line A-B of FIG. 1.
Figure 1C:
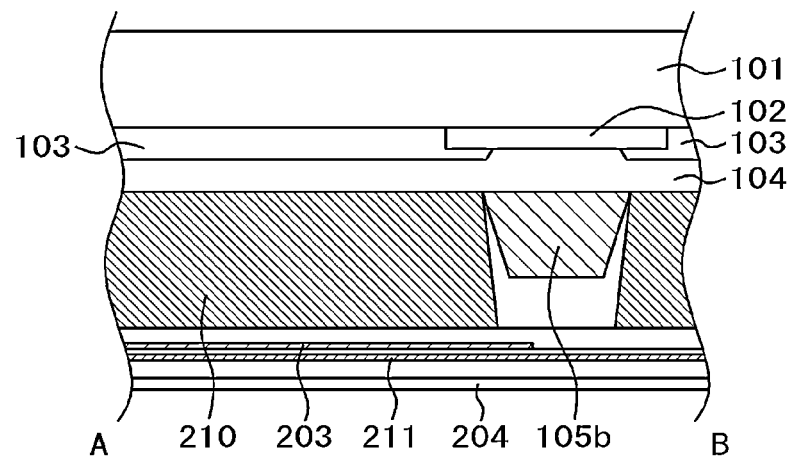
FIG. 1C is a schematic sectional view of a main part of another liquid crystal display device, taken along line A-B of FIG. 1.

For the purpose of solving the aforementioned problem, the inventors prepared the structure having a stopper (columnar spacer, columnar protrusion or the like) provided in an area where the light shielding BM is formed at the CF substrate side so as not to cause a positional gap between the TFT substrate and the CF substrate which are laminated. FIG. 1A is a schematic plan view of a main part of the liquid crystal display device according to an embodiment. A wall electrode 203 as a pixel electrode is formed along a side wall of a wall 210. A stopper (columnar spacer or columnar protrusion) 105 is provided between vertically adjacent sub pixels in the absence of the wall 210 corresponding to the region where the light shielding BM 102 is formed. FIGS. 1B and 1C are schematic sectional views of a main part of the liquid crystal display device, taken along line A-B of FIG. 1A. FIG. 1B illustrates a columnar spacer 105a as the stopper 105, and FIG. 1C illustrates a columnar protrusion 105b as the stopper 105.

The wall electrode IPS type liquid crystal display device as shown in FIG. 1B includes the stopper (columnar spacer) 105a provided at the upper part of the light shielding BM via an OC 104, which is applied to the CF substrate opposite the TFT substrate where the wall electrode is formed so as to hold a liquid crystal cell gap. The wall-like protrusion (wall) 210 where the wall electrode is formed is shorter than the liquid crystal cell gap (height of the columnar spacer). The columnar spacer 105a provided between the adjacent walls 210 ensures prevention of the positional gap between the upper and the lower substrates even if those substrates undergo application of force. In case the positional gap is generated between the upper and the lower substrates, the space between the wall 210 and the OC 104 serves to suppress damage on the interface between the upper and the lower substrates. It is therefore possible to provide the liquid crystal display device configured to lessen and prevent deterioration (in contrast) in the display image quality owing to friction and impact on the display. A gate wiring (not shown) expected to be a scanning signal line is provided in an area of the light shielding BM that extends in the direction orthogonal to the wall 210 so that the wiring and the film are overlapped in planar view.

The wall electrode IPS type liquid crystal display device shown in FIG. 10 includes the wall spacer (wall) 210 where the wall electrode is formed for holding the liquid crystal cell gap. A recess is formed in a region as an intersection between an extension of the wall 210 and the gate wiring (not shown). The stopper (columnar protrusion) 105b is provided to be fitted to the corresponding recess so as to be overlapped with the position of the light shielding BM 102 on the counter substrate via the OC 104 in planar view. This makes it possible to provide the liquid crystal display device configured to lessen and prevent the positional gap between the upper and the lower substrates, and to further lessen and prevent deterioration in the displayed image quality owing to friction and impact on the display.

The present invention is applicable to the liquid crystal display device having the electrode itself formed into the wall-like structure in addition to the one having the electrode formed on the side wall part of the wall-like insulating film.

The present invention will be described in detail in reference to embodiments. The same codes in the embodiments will refer to the same elements.

First Embodiment

A first embodiment of the present invention will be described referring to FIGS. 3A and 3B.

Figure 3A:
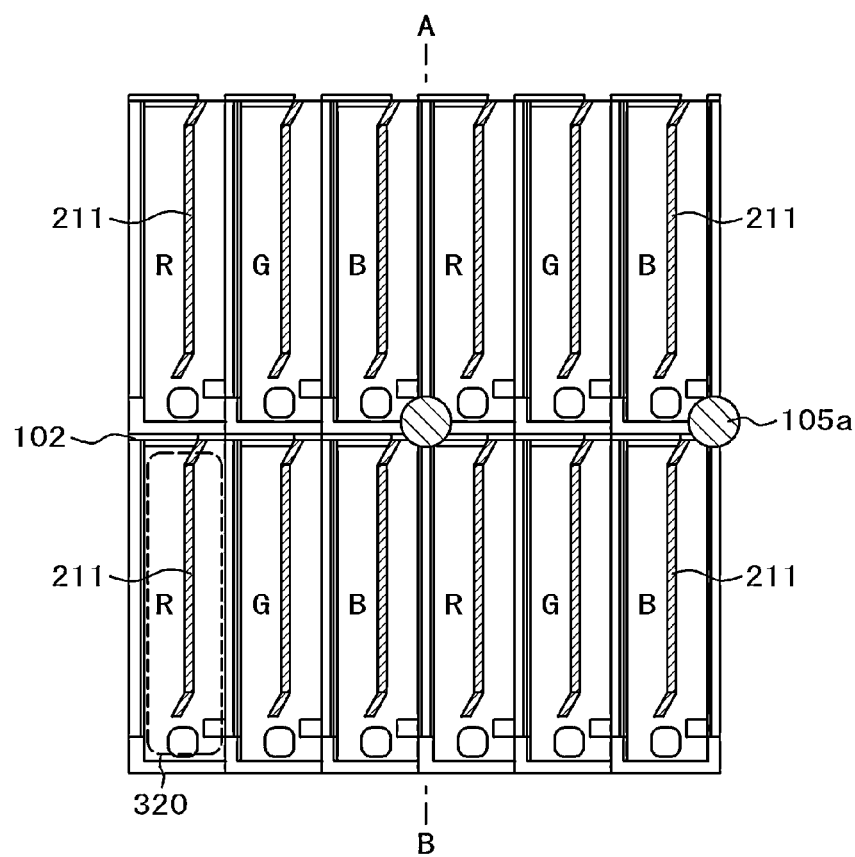
FIG. 3A is a schematic plan view of a main part of a liquid crystal display device according to a first embodiment of the present invention.
Figure 3B:
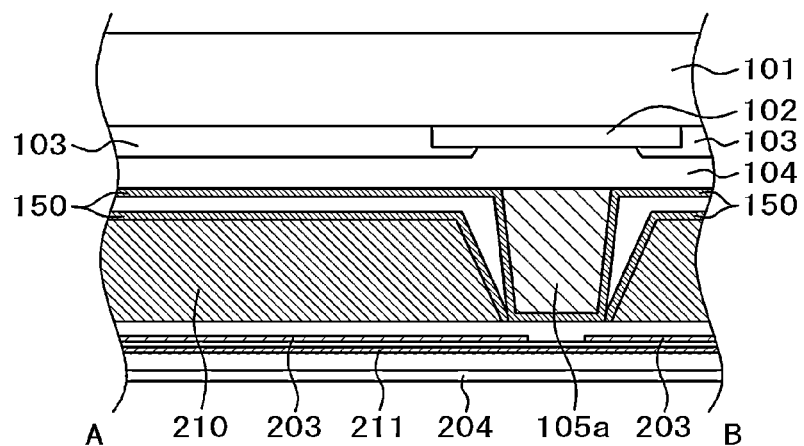
FIG. 3B is a schematic sectional view of the main part of the liquid crystal display device, taken along line A-B of FIG. 3A.

FIG. 3A is a schematic plan view of a main part of the liquid crystal display device according to this embodiment, and FIG. 3B is a schematic sectional view of the main part, taken along line A-B of FIG. 3A. The columnar spacer 105a which holds the liquid crystal cell gap and functions as the stopper is provided in the area corresponding to the light shielding BM 102 on the CF substrate opposite the TFT substrate where the wall electrode 203 is formed so that the spacer is overlapped with the light shielding BM in planar view. As the columnar spacer 105a is fitted to the recess between the walls 210, the positional gap between the upper and the lower substrates is unlikely to occur in spite of the force applied to those substrates. The wall-like protrusion (wall) 210 where the wall electrode 203 is formed is lower than the liquid crystal cell gap (height of the columnar spacer: about 3 μm) by 0.1 to 1.0 μm, approximately. If the positional gap between the upper and the lower substrates occurs, the space between the wall-like protrusion 210 and the OC 104 serves to prevent damage to the alignment films of the upper and the lower substrates. As a result, such structure serves to suppress stripping of the alignment film and generation of bubbles caused by the positional gap by friction between the upper and the lower substrates, resulting from friction and impact on the display. It is therefore possible to provide the liquid crystal display device configured to lessen and prevent deterioration in the displayed image quality (degraded contrast, generation of bright spot caused by alignment failure). The wall-like protrusion is lower than the columnar spacer to be employed. However, the structure hardly gives an adverse influence on the function as the wall electrode so long as the difference in height is in the range from 0.1 μm to 0.3 μm. As the difference becomes large, the resistance to the external force is enhanced. In this embodiment, the upper limit of the difference is set to 1.0 μm in consideration of the function as the wall electrode and the resistance to the external force.

It is possible to impart the liquid crystal alignment regulating force to the photo alignment film as the alignment film that is applied even to the wall electrode. This makes it possible to improve the contrast.

Referring to FIG. 3A, it is preferable to form the recess to which the columnar spacer 105a is fitted at the location where an extension of the wall formed at the boundary between the blue sub pixel (B) and the red sub pixel (R) intersects with the gate wiring (not shown) substantially orthogonal thereto, rather than at the boundary between the blue or red sub pixel and the green sub pixel (G) which appears to be the brightest. In this embodiment, the pixel includes three sub pixels, that is, the blue sub pixel (B), the red sub pixel (R) and the green sub pixel (G). A white sub pixel (W) may be added to those three sub pixels, that is, four sub pixels in total. In this case, it is also preferable to form the columnar spacer 105a at the boundary between the sub pixels (B) and (R). The gate wiring is formed on the region where the horizontally extending light shielding BM is applied so as to be overlapped therewith in planar view.

The tip diameter of the columnar spacer 105a formed on the counter substrate is set to be substantially the same as the width of the bottom surface of the recess formed between the wall-like protrusions 210, to which the columnar spacer 105a is fitted. Then the tilt angle of the side wall of the columnar spacer 105a with respect to the counter substrate is made more acute than the angle of the side wall of the recess formed between the wall-like protrusions 210 with respect to the TFT substrate. As a result, the opening diameter of the recess becomes larger than the tip diameter of the wall so that the positioning tolerance between the TFT substrate and the counter substrate is improved. The aforementioned phrase "substantially the same" includes the allowable range of +/−3 μm.

In regard to the aforementioned structure, the columnar spacer 105a functions as a main spacer, and the wall-like protrusion 210 functions as a sub-spacer. That is, in case the columnar spacer is crushed under the compression stress vertically exerted to the upper and the lower substrate, the wall-like protrusion 210 functions as the spacer. The crushed columnar spacer retains its function as the stopper. The gate wiring (not shown) to be formed as the scanning signal line is provided on the area corresponding to the light shielding BM extending in the direction orthogonal to the wall-like protrusion 210, which is overlapped with the gate wiring in planar view.

This embodiment provides the liquid crystal display device capable of lessening deterioration in the image quality due to friction and impact. The photo alignment film is employed as the alignment film so as to improve the contrast.

Second Embodiment

A second embodiment according to the present invention will be described referring to FIGS. 4A and 4B. What has been described about the first embodiment, if not described in connection with the present embodiment, applies to the present embodiment except under exceptional circumstances.

Figure 4A:
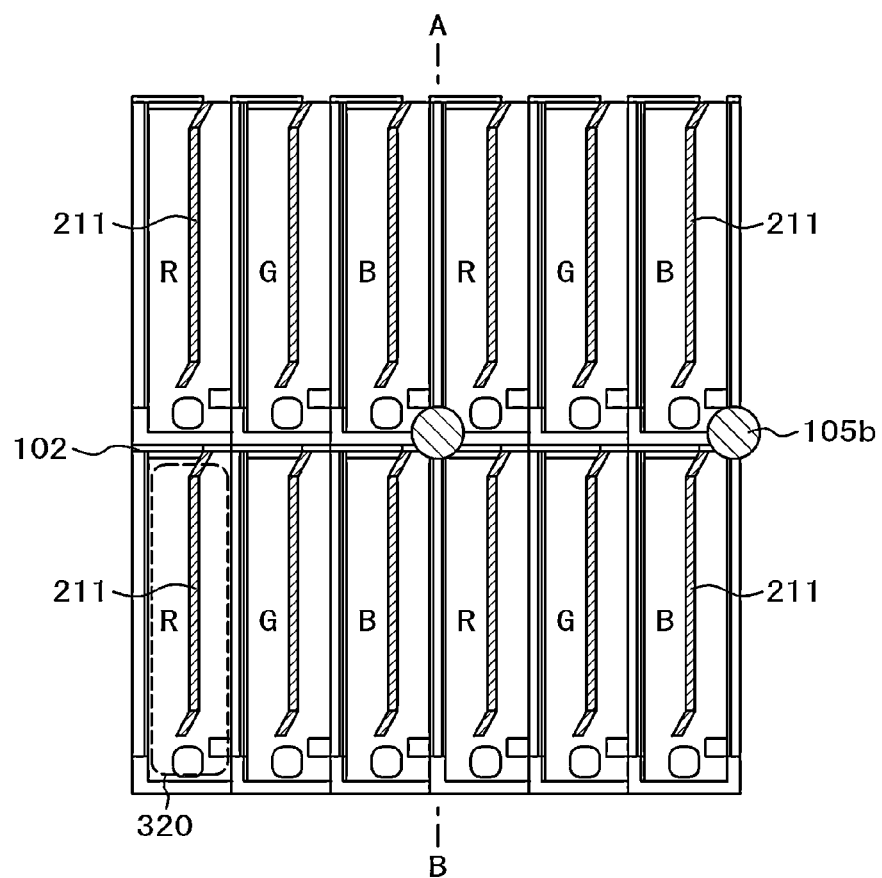
FIG. 4A is a schematic plan view of a main part of a liquid crystal display device according to a second embodiment of the present invention.
Figure 4B:
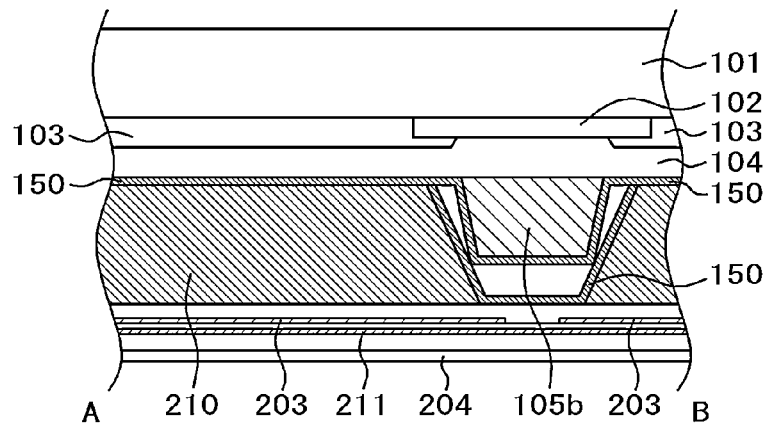
FIG. 4B is a schematic sectional view of the main part of the liquid crystal display device, taken along line A-B of FIG. 4A.

FIG. 4A is a schematic plan view of a main part of a liquid crystal display device according to the embodiment. FIG. 4B is a schematic sectional view of the main part, taken along line A-B of FIG. 4A. The wall electrode IPS type liquid crystal display device according to the embodiment has the wall spacer 210 where the wall electrode is formed, which is configured to hold the liquid crystal cell gap. The recess is formed between the wall spacers 210 in the area where the extension of the wall spacer 210 intersects with the gate wiring. The columnar protrusion 105b having the stopper function is provided at the position overlapped with the light shielding BM formed on the counter substrate in planar view. As the columnar protrusion 105b is fitted to the recess between the wall spacers 210, it functions as the stopper for preventing the positional gap between the upper and the lower substrates. This embodiment allows prevention of stripping of the alignment film, which is induced by the contact of the tip of the wall spacer 210 with the alignment film 150 at the CF substrate side. This suppresses stripping of the alignment film and generation of bubbles caused by the positional gap by friction between the upper and the lower substrate resulting from friction and impact on the display. It is therefore possible to provide the liquid crystal display device configured to lessen and prevent deterioration in the displayed image quality (degraded contrast and generation of bright part owing to alignment failure).

It is more preferable to locate the columnar protrusion 105b to be fitted to the recess at the position where the extended line of the wall spacer at the boundary between the blue sub pixel (B) and the red sub pixel (R) interests with the gate wiring (not shown) substantially orthogonal to the line as shown in FIG. 4, rather than at the position around the boundary between the blue or red sub pixel and the green sub pixel (G) which appears to be the brightest. This embodiment uses three color sub pixels including blue (B), red (R) and green (G). Preferably, four color sub pixels including the added white sub pixel (W) are employed so that the columnar spacer 105a is located at the boundary between the blue sub pixel (B) and the red sub pixel (R) as described above. The gate wiring is formed on the region where the horizontally extending light shielding BM is formed so that they are overlapped with each other in planar view.

The tip diameter of the wall of the columnar protrusion 105b formed on the counter substrate is larger than the width of the bottom surface of the recess formed between the wall spacers 210, to which the columnar protrusion 105b is fitted. The tilt angle of the side wall of the columnar protrusion 105b with respect to the counter substrate is made more acute than the angle of the side wall of the recess formed between the wall spacers 210 with respect to the TFT substrate. The aforementioned structure improves fitting between the columnar protrusion 105b and the recess formed between the wall spacers 210, thus enhancing the function as the stopper for preventing the positional gap between the upper and the lower substrates.

It is possible to impart the liquid crystal alignment regulating force to the photo alignment film as the alignment film even if such film is applied to the wall electrode. This makes it possible to improve the contrast.

This embodiment also provides the similar advantages to those derived from the first embodiment. The tip of the columnar protrusion is intruded into the side wall of the recess of the wall spacer so as to improve the function as the stopper for preventing the positional gap between the upper and the lower substrates.

Third Embodiment

A third embodiment according to the present invention will be described referring to FIGS. 5A and 5B. What has been described about the first embodiment or the second embodiment, if not described in connection with the present embodiment, applies to the present embodiment except under exceptional circumstances.

Figure 5A:
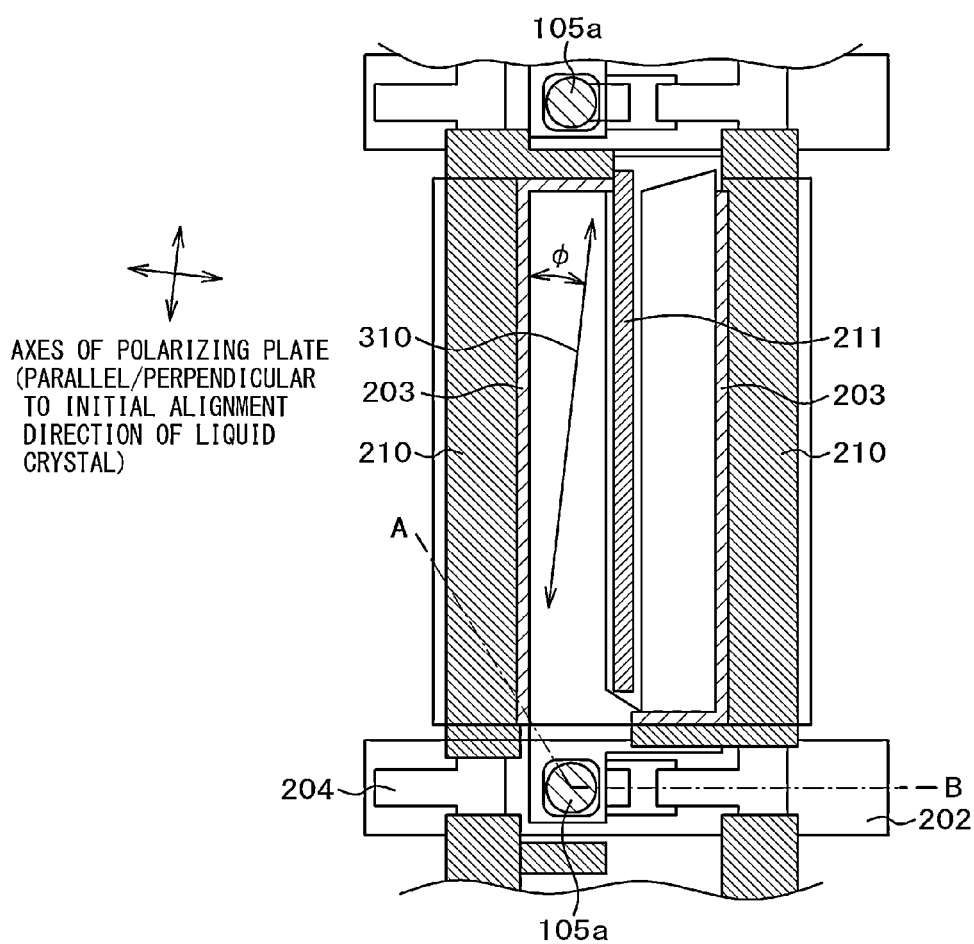
FIG. 5A is a schematic plan view of a main part of a liquid crystal display device according to a third embodiment of the present invention.

FIG. 5A is a schematic plan view of a main part of a liquid crystal display device according to this embodiment, and FIG. 5B is a schematic sectional view of the main part, taken along line A-B of FIG. 5A. The wall electrode IPS type liquid crystal display device according to this embodiment includes the columnar spacer 105a configured to hold the liquid crystal cell gap in the region where the light shielding BM 102 is applied to the CF substrate opposite the TFT substrate to which the wall electrode 203 is formed so that the spacer is overlapped with the light shielding BM in planar view, and to have the stopper function. It is noted that reference numeral 202 denotes a gate wiring as a scanning signal line, and reference numeral 206 denotes a TFT. The pixel electrode is connected to a source electrode of the TFT.

The wall-like protrusion 210 where the wall electrode 203 is formed is shorter than the liquid crystal cell gap by approximately 0.1 to 1.0 µm. Specifically, the columnar spacer serves as the main spacer, and the wall-like protrusion serves as the sub spacer.

The columnar spacer 105a is disposed in a contact hole just below the light shielding BM 102. Preferably, the contact hole is formed in the blue sub pixel (B).

The tilt angle of the side wall of the columnar spacer 105a with respect to a glass substrate 101 is more acute (larger) than that of the side wall of the contact hole with respect to the glass substrate 201. As a result, the opening at the upper part of the contact hole is larger than the tip of the columnar spacer 105a which may be easily fitted to the contact hole. In this case, the columnar spacer is fitted to the inside of the contact hole, which makes it possible to enhance resistance against friction and impact from all directions at a full 360 degrees.

Figure 2A:
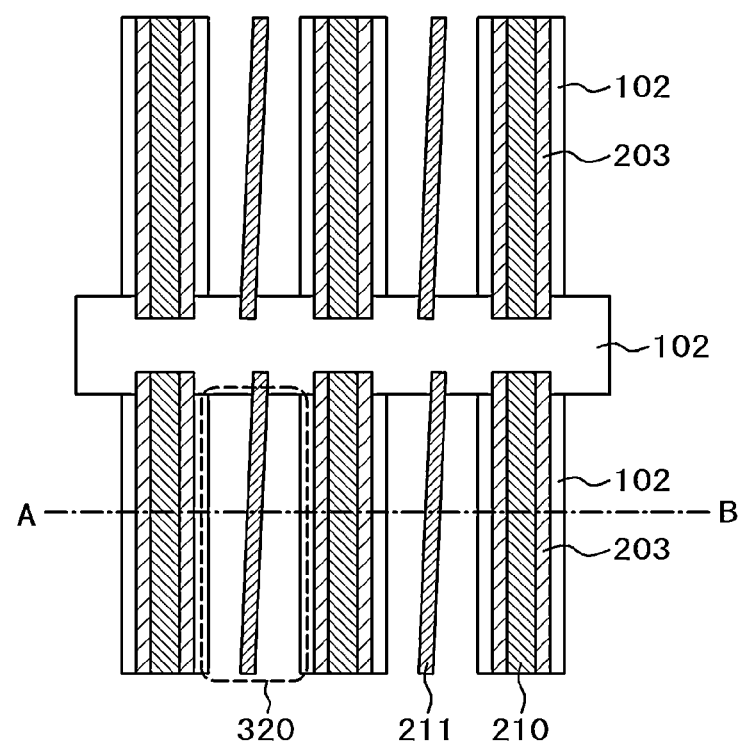
FIG. 2A is a schematic plan view of a main part of a wall electrode IPS type liquid crystal display device investigated by the inventors.
Figure 2B:
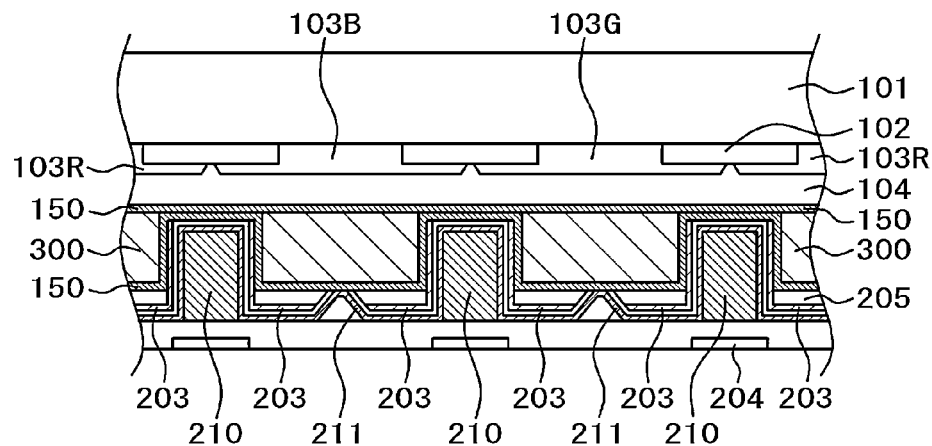
FIG. 2B is a schematic sectional view of the main part of the wall electrode IPS type liquid crystal display device, taken along line A-B of FIG. 2A.

The liquid crystal display device is configured to have a polarizing plate while vertically arranging the TFT substrate and the CF substrate for interposing the liquid crystal, and the backlight, the touch panel and the like if necessary, stored in a casing. On this occasion, axes of the polarizing plate are set parallel to or at right angles to a direction 310 of the initial alignment of the liquid crystal. As a result of application of impact to the liquid crystal display device having the structure as shown in FIGS. 5A and 5B, and the liquid crystal display device as shown in FIGS. 2A and 2B at a low temperature of −20° C., no failure was observed in the former case, and the display failure was observed in the latter case.

The embodiment provides the similar advantages to those derived from the first embodiment. The columnar spacer is fitted to the contact hole to improve the stopper function for preventing the positional gap between the upper and the lower substrates compared with the structure as described in the first and the second embodiment.

The invention is not limited to the embodiments as described above, and may include various modifications. The embodiments have been described in detail for better understanding of the invention, and are not necessarily restricted to the one provided with all the structures as described above. The structure of any one of the embodiments may be partially replaced with that of the other embodiment. Alternatively, it is possible to add the structure of any one of the embodiments to that of the other one. It is also possible to have the part of the structure of the respective embodiments added to, removed from and replaced with the other structure.

What is claimed is:

1. A liquid crystal display device comprising:
a first substrate which includes a gate wiring to be formed as a scanning signal line; a second substrate which includes a black matrix; and a liquid crystal interposed between the first substrate and the second substrate; the liquid crystal being driven by an electric field which is substantially parallel with the first substrate;
wherein the first substrate has a recess and a wall-like protrusion,
the recess is formed in a region where the wall-like protrusion intersect with the gate wiring in planar view,
the second substrate has a columnar protrusion, and
the columnar protrusion of the second substrate is fitted to the recess of the first substrate, and is a stopper for preventing a positional gap between the first substrate and the second substrate.

2. The liquid crystal display device according to claim 1, wherein
the columnar protrusion is a columnar spacer provided in a region where it is overlapped with the black matrix in planar view for holding a cell gap between the first substrate and the second substrate.

3. The liquid crystal display device according to claim 2, wherein the columnar spacer is higher than the wall-like protrusion by 0.1 to 1.0 µm.

4. The liquid crystal display device according to claim 2, wherein the second substrate includes at least a blue filter, a red filter and a green filter so that at least a blue sub pixel, a red sub pixel and a green sub pixel are formed between the first substrate and the second substrate, respectively, and
the columnar spacer is provided at a boundary between the blue sub pixel and the red sub pixel.

5. The liquid crystal display device according to claim 2, wherein a tilt angle of a side wall of the columnar spacer with respect to the second substrate is larger than a tilt angle of a side wall of the wall-like protrusion with respect to the first substrate.

6. The liquid crystal display device according to claim 2, wherein a photo alignment film is used as an alignment film formed on an upper part of the wall-like protrusion on the first substrate.

7. The liquid crystal display device according to claim 1, wherein the recess is holding a cell gap between the first substrate and the second substrate; and
the columnar protrusion is formed in a region where it is overlapped with the black matrix in planar view.

8. The liquid crystal display device according to claim 7, wherein the second substrate includes at least a blue filter, a red filter and a green filter so that at least a blue sub pixel, a red sub pixel and a green sub pixel are formed between the first substrate and the second substrate, respectively, and
the columnar protrusion is provided at a boundary between the blue sub pixel and the red sub pixel.

9. The liquid crystal display device according to claim 7, wherein a tilt angle of a side wall of the columnar spacer with respect to the second substrate is larger than a tilt angle of a side wall of the wall-like protrusion with respect to the first substrate.

10. The liquid crystal display device according to claim 1, wherein the first substrate includes a contact hole for electrical contact with a conductive region formed in a lower layer;
the recess is formed at a position where it is overlapped with the contact hole formed in the first substrate in planar view, and
the columnar protrusion is a columnar spacer which is provided in a region where it is overlapped with the black matrix in planar view, and holding a cell gap between the first substrate and the second substrate.

11. The liquid crystal display device according to claim 10,
wherein the first substrate includes a wall-like protrusion having an electrode for generating the horizontal electric field; and
the columnar spacer is higher than the wall-like protrusion by 0.1 to 1.0 μm.

12. The liquid crystal display device according to claim 10,
wherein the second substrate includes at least a blue filter, a red filter and a green filter so that at least a blue sub pixel, a red sub pixel and a green sub pixel are formed between the first substrate and the second substrate, respectively, and
the columnar spacer is provided in a region of the blue sub pixel.

13. The liquid crystal display device according to claim 10, wherein a tilt angle of a side wall of the columnar spacer with respect to the second substrate is larger than a tilt angle of a side wall of the contact hole with respect to the first substrate.

14. A liquid crystal display device including a first substrate, a second substrate on which a black matrix is formed, and a liquid crystal interposed between the first substrate and the second substrate, which drives the liquid crystal in a horizontal electric field,
wherein the first substrate includes a wall-like protrusion provided with a first electrode, and a second electrode which is formed between the adjacent wall-like protrusions for generating the horizontal electric field between the first electrode and the second electrode for each sub pixel;
the second substrate includes a columnar spacer provided in a region where the black matrix is formed in planar view corresponding to a recess on an extension of the wall-like protrusion of the sub pixel for holding a cell gap between the first substrate and the second substrate, and
the columnar spacer is fitted to the recess between the wall-like protrusions of the sub pixel so as to function as a stopper for preventing a positional gap between the first and the second substrate.

15. A liquid crystal display device comprising a first substrate which has a TFT, a second substrate which has a black matrix, and a liquid crystal interposed between the first substrate and the second substrate, the liquid crystal is driven by an electric field,
wherein the first substrate includes a wall-like protrusion provided with a first electrode, a second electrode which is formed between the adjacent wall-like protrusions for generating the electric field between the first electrode and the second electrode, and a contact hole for electrical contact with a conductive region which constitutes the TFT for each sub pixel;
the second substrate includes a columnar spacer provided in a region where the black matrix is formed in planar view corresponding to the contact hole of the sub pixel for holding a cell gap between the first substrate and the second substrate, and
the columnar spacer is fitted to the contact hole of the sub pixel, and is a stopper for preventing a positional gap between the first and the second substrate.

* * * * *